United States Patent
Kuo et al.

(10) Patent No.: US 11,306,898 B2
(45) Date of Patent: Apr. 19, 2022

(54) WAVELENGTH CONVERSION ELEMENT

(71) Applicant: DELTA ELECTRONICS, INC., Taoyuan (TW)

(72) Inventors: Po-Tsun Kuo, Taoyuan (TW); Yen-I Chou, Taoyuan (TW)

(73) Assignee: DELTA ELECTRONICS, INC., Taoyuan (TW)

( * ) Notice: Subject to any disclaimer, the term of this patent is extended or adjusted under 35 U.S.C. 154(b) by 88 days.

(21) Appl. No.: 16/865,431

(22) Filed: May 4, 2020

(65) Prior Publication Data

US 2021/0202912 A1 Jul. 1, 2021

Related U.S. Application Data

(60) Provisional application No. 62/953,909, filed on Dec. 26, 2019.

(51) Int. Cl.
| | |
|---|---|
| *F21V 9/38* | (2018.01) |
| *F21V 7/30* | (2018.01) |
| *H01L 51/52* | (2006.01) |
| *C09K 11/02* | (2006.01) |
| *C09K 11/08* | (2006.01) |

(52) U.S. Cl.
CPC .............. *F21V 7/30* (2018.02); *F21V 9/38* (2018.02); *H01L 51/5271* (2013.01); *H01L 51/5281* (2013.01); *C09K 11/02* (2013.01); *C09K 11/08* (2013.01)

(58) Field of Classification Search
CPC ........................................................ F21V 9/38
USPC ....................................................... 362/617
See application file for complete search history.

(56) References Cited

U.S. PATENT DOCUMENTS

| | | | | |
|---|---|---|---|---|
| 9,874,741 | B2 | 1/2018 | Egawa et al. | |
| 10,261,403 | B2 | 4/2019 | Itoh | |
| 10,474,019 | B2 | 11/2019 | Ikeda et al. | |
| 2012/0112630 | A1* | 5/2012 | Park .................... | F21K 9/00 313/506 |
| 2015/0252964 | A1* | 9/2015 | Takahashi ............. | F21K 9/64 362/84 |
| 2018/0216800 | A1* | 8/2018 | Yamanaka ............ | G02B 5/20 |
| 2018/0274737 | A1* | 9/2018 | Abe ...................... | F21V 9/32 |

(Continued)

FOREIGN PATENT DOCUMENTS

| | | |
|---|---|---|
| CN | 102723421 A | 10/2012 |
| CN | 103563108 A | 2/2014 |
| CN | 105301878 A | 2/2016 |

(Continued)

*Primary Examiner* — Christopher M Raabe
(74) *Attorney, Agent, or Firm* — CKC & Partners Co., LLC

(57) ABSTRACT

A wavelength conversion element includes a substrate, a reflective layer, an inorganic light luminescence layer and an organic light luminescence layer. The reflective layer is disposed over the substrate. The inorganic light luminescence layer is disposed over the reflective layer and includes a first fluorescent material. The organic light luminescence layer is disposed between the reflective layer and the inorganic light luminescence layer, and includes a second fluorescent material. A refractive index of the inorganic light luminescence layer is greater than that of the organic light luminescence layer, and a thickness of the inorganic light luminescence layer is greater than a thickness of the organic light luminescence layer.

12 Claims, 3 Drawing Sheets

(56) References Cited

U.S. PATENT DOCUMENTS

2019/0187543 A1\* 6/2019 Watanabe ............... F21S 8/026

FOREIGN PATENT DOCUMENTS

| CN | 105322433 A | 2/2016 |
|---|---|---|
| CN | 106195925 A | 12/2016 |
| CN | 106374027 A | 2/2017 |
| CN | 107678238 A | 2/2018 |
| CN | 109560179 A | 4/2019 |
| CN | 109681846 A | 4/2019 |
| CN | 209249479 U | 8/2019 |
| TW | 201610364 A | 3/2016 |
| TW | I582520 B | 5/2017 |
| TW | 201807846 A | 3/2018 |
| TW | I677648 B | 11/2019 |

\* cited by examiner

WAVELENGTH CONVERSION ELEMENT

CROSS-REFERENCE TO RELATED APPLICATION

This application claims priority to U.S. Provisional Application Ser. No. 62/953,909, filed Dec. 26, 2019, the disclosures of which are incorporated herein by reference in their entireties.

BACKGROUND

Technical Field

The present disclosure relates to a wavelength conversion element.

Description of Related Art

With the development of high intensity laser projection technology, there has been known a light source device irradiating a fluorescent material with excitation light emitted from a light source. Generally, an organic binder, such as transparent epoxy resin or silicone glue, is used as a glue binder to encapsulate the fluorescent particles. The organic binder is smeared on a reflective metal plate to form a wavelength conversion element.

However, since the thermal conductivity of the organic binder is low, as the power of laser irradiating the wavelength conversion element continues to increase, the massive heat generated in the organic binder cannot be transferred to the metal substrate quickly. Thus, the luminous efficiency is decreased and adversely affects the performance of the wavelength conversion element.

SUMMARY

One aspect of the present disclosure is a wavelength conversion element.

According to some embodiments of the present disclosure, a wavelength conversion element includes a substrate, a reflective layer, an inorganic light luminescence layer and an organic light luminescence layer. The reflective layer is disposed over the substrate. The inorganic light luminescence layer is disposed over the reflective layer and includes a first fluorescent material. The organic light luminescence layer is disposed between the reflective layer and the inorganic light luminescence layer and includes a second fluorescent material. A refractive index of the inorganic light luminescence layer is greater than that of the organic light luminescence layer, and a thickness of the inorganic light luminescence layer is greater than a thickness of the organic light luminescence layer.

In some embodiments, a concentration of the first fluorescent material of the inorganic light luminescence layer is in a range from 50 wt % to 100 wt %.

In some embodiments, the inorganic light luminescence layer includes a first glue binder made of glass, ceramic, or fluorescent ceramic.

In some embodiments, the organic light luminescence layer includes a second glue binder and a fluorescent particle.

In some embodiments, the second glue binder of the organic light luminescence layer is made of resin or silicone.

In some embodiments, a concentration of the fluorescent particle of the organic light luminescence layer is in a range from 1 wt % to 88 wt %.

In some embodiments, a peak wavelength of fluorescent light from the organic light luminescence layer is greater than that of the inorganic light luminescence layer.

In some embodiments, the thickness of the inorganic light luminescence layer is in a range from 0.02 mm to 1 mm.

In some embodiments, the thickness of the organic light luminescence layer is in a range from 1 μm to 500 μm.

In some embodiments, the organic light luminescence layer further extends to a top surface of the inorganic light luminescence layer along a sidewall of the inorganic light luminescence layer.

In some embodiments, the wavelength conversion element further includes an anti-reflective coating film or a microstructure on the top surface of the inorganic light luminescence layer.

In some embodiments, the organic light luminescence layer further includes a white functional particle therein, and a refractive index of the white functional particle is greater than 1.7 and smaller than 3.

In some embodiments, the white functional particle is made of $Al_2O_3$, $TiO_2$, $ZnO$, $ZrO_2$, or $Ta_2O_5$.

In the aforementioned embodiments, since the organic light luminescence layer is disposed between the reflective layer and the inorganic light luminescence layer, thermal conduction can be increased. As a result, the life span and the performance of the wavelength conversion element can be improved.

It is to be understood that both the foregoing general description and the following detailed description are by examples, and are intended to provide further explanation of the disclosure as claimed.

BRIEF DESCRIPTION OF THE DRAWINGS

The disclosure can be more fully understood by reading the following detailed description of the embodiment, with reference made to the accompanying drawings as follows.

DETAILED DESCRIPTION

Figure 1:
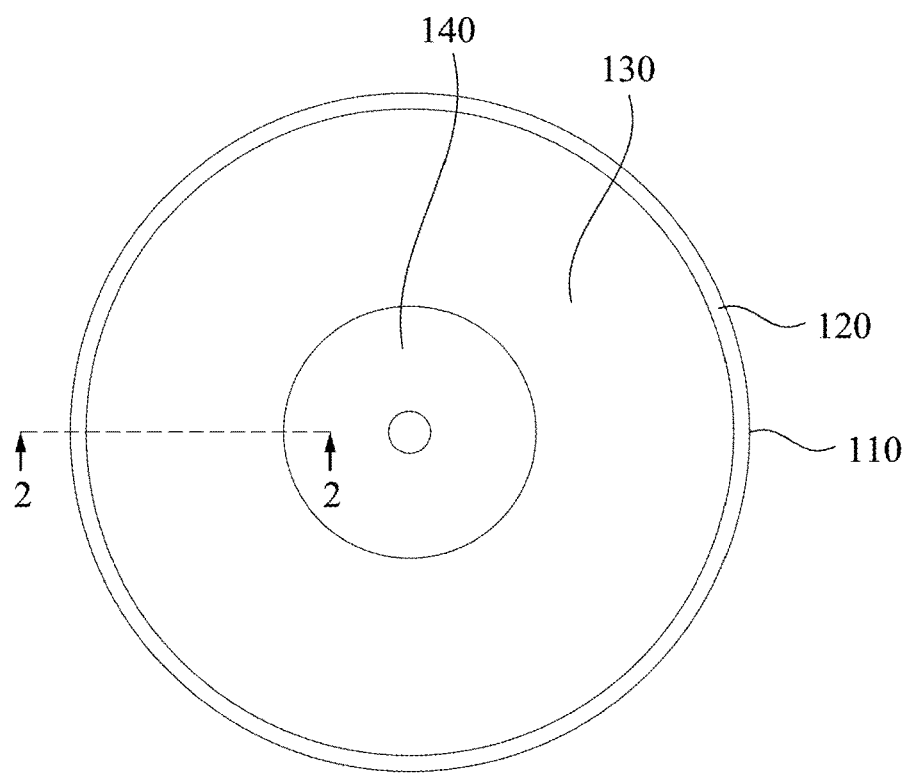
FIG. 1 is a top view of a wavelength conversion element in accordance with one embodiment of the present disclosure.

Reference will now be made in detail to the present embodiments of the disclosure, examples of which are illustrated in the accompanying drawings. Wherever possible, the same reference numbers are used in the drawings and the description to refer to the same or like parts.

Figure 2:
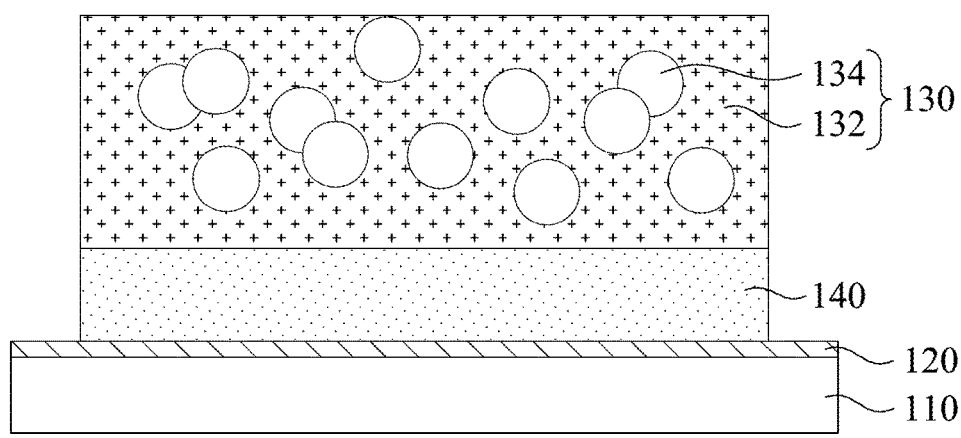
FIG. 2 is a cross-sectional view of the wavelength conversion element taken along line 2-2 of FIG. 1.

FIG. 1 is a top view of a wavelength conversion element 100 in accordance with one embodiment of the present disclosure, and FIG. 2 is a cross-sectional view of the wavelength conversion element 100 taken along line 2-2 of FIG. 1. Referring to FIG. 1 and FIG. 2, the wavelength conversion element 100 includes a substrate 110, a reflective layer 120, an inorganic light luminescence layer 130 including a first fluorescent material, and an organic layer 140. The reflective layer 120 is disposed over the substrate 110. The inorganic light luminescence layer 130 is disposed over the reflective layer 120. The organic layer 140 is disposed between the reflective layer 120 and the inorganic light luminescence layer 130. In the present embodiment, a thickness of the inorganic light luminescence layer 130 is greater than a thickness of the organic layer 140. In some embodiments, a top surface of the organic layer 140 and a bottom surface of the organic layer 140 are respectively in contact with the inorganic light luminescence layer 130 and the reflective layer 120. In some embodiments, the organic layer 140 may be made of resin, silicone, or other suitable materials.

In the present embodiments, the wavelength conversion element 100 is a reflective wheel of a projector, such as 3DLP (Digital light process) projector. As shown in FIG. 1, the wavelength conversion element 100 has a circle shape in the front view. The inorganic light luminescence layer 130 and the organic layer 140 have a ring-like shape in the front view. In some embodiments, the substrate 110 is a circular disk. The substrate 110 may be made of quartz glass, quartz crystal, sapphire, optical glass, or transparent resin, but the present disclosure is not limited in this regard.

The reflective layer 120 may be formed on the substrate 110 by sputtering or other suitable method, and thus the reflective layer 120 is in contact with a top surface of the substrate 110. Further, the reflective layer 120 may be made of metal, such as silver or aluminum mirror. In some embodiments, the reflective layer 120 may include a plurality of high reflective film, such as dielectric reflective films, or metal/dielectric composite films.

In some embodiments, a concentration of the first fluorescent material of the inorganic light luminescence layer 130 is in a range from 50 wt % to 100 wt %. The first fluorescent material of the inorganic light luminescence layer 130 may include a first glue binder 132 and a fluorescent particle 134, in which the first glue binder 132 is configured to package the fluorescent particle 134, such as a phosphorous particle (e.g., phosphor). In some embodiments, the first glue binder 132 of the inorganic light luminescence layer 130 may be made of glass, ceramic, or other suitable materials. The fluorescent particle 134 may be made of yttrium aluminum garnet (YAG). In other embodiments, the first fluorescent material of the inorganic light luminescence layer 130 may be made of a fluorescent ceramic, and the inorganic light luminescence layer 130 may be formed by performing a sintering process.

Compared to an organic material, the inorganic material of the light luminescence layer 130 consists of strong atomic bond and have higher melting point. For example, the melting point of ceramic is up to about 1700 degrees Celsius. As such, even when the inorganic light luminescence layer 130 is irradiated with high energy or exposed at high temperature, the fluorescent particle 134 of the inorganic light luminescence layer 130 is not easily destroyed by thermal impact. In some embodiments, the inorganic light luminescence layer 130 can endure light irradiation (e.g., blue laser) with high power. Further, the inorganic material of the inorganic light luminescence layer 130 has higher thermal conductivity than organic materials, which leads to lower heat resistance.

It is to be noted that the connection relationships and materials of the elements described above will not be repeated in the following description, and other aspects related to different types of wavelength conversion elements will be described.

Figure 3:
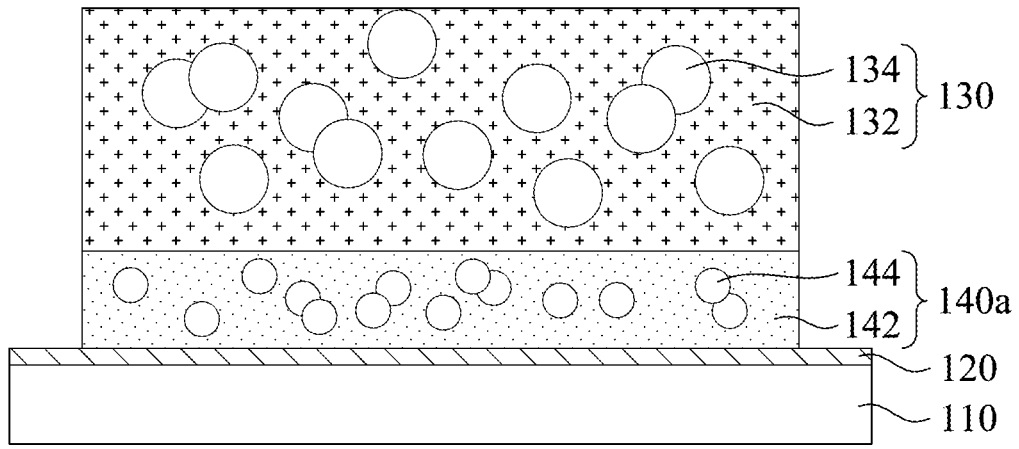
FIG. 3 is a cross-sectional view of a wavelength conversion element in accordance with another embodiment of the present disclosure.

FIG. 3 is a cross-sectional view of a wavelength conversion element 100a in accordance with another embodiment of the present disclosure. As shown in FIG. 3, the wavelength conversion element 100a includes the substrate 110, the reflective layer 120, the inorganic light luminescence layer 130, and an organic light luminescence layer 140a. Compared to the organic layer 140 of the wavelength conversion element 100 in FIG. 2, the organic light luminescence layer 140a of the wavelength conversion element 100a in FIG. 3 further includes a second fluorescent material therein. Configurations of the substrate 110, the reflective layer 120 and the inorganic light luminescence layer 130 are similar to the embodiment shown in FIG. 2, and the description is not repeated hereinafter.

In the present embodiments, the second fluorescent material of the organic light luminescence layer 140a includes a second glue binder 142 and a fluorescent particle 144. In some embodiments, the glue binder 142 of the organic light luminescence layer 140a is an organic material. As such, the second glue binder 142 is beneficial to adjust wavelength and efficiency of the light conversion. The second glue binder 142 is configured to package the fluorescent particle 144, such as a phosphorous particle (e.g., phosphor). The second glue binder 142 may be made of resin, silicone, or other suitable materials. The fluorescent particle 144 may be made of yttrium aluminum garnet (YAG). In some embodiments, the organic light luminescence layer 140a can increase the utilization of light irradiation (e.g., blue laser).

In the present embodiment, the thickness of the inorganic light luminescence layer 130 is greater than the thickness of the organic light luminescence layer 140a. For example, the thickness of the inorganic light luminescence layer 130 is in a range from 0.02 mm to 1 mm, and the thickness of the organic light luminescence layer 140a is in a range from 1 μm to 500 μm. For the purpose of reducing light scattering and heat resistance, the thickness of the inorganic light luminescence layer 130 may be in a range from 0.05 mm to 0.5 mm, and the thickness of the organic light luminescence layer 140a may be in a range from 10 μm to 300 μm. Since the organic light luminescence layer 140a is thin enough (for example, in a range from 1 μm to 500 μm), an increase of the temperature can be avoided or ignored. Further, since the organic light luminescence layer 140a is disposed between the inorganic light luminescence layer 130 and the reflective layer 120, the heat is not easily accumulated due to the inorganic light luminescence layer 130 that includes the inorganic material, and there is no adverse effect such as reduction of illuminant efficiency.

In some embodiments, a concentration of the fluorescent particle 144 of the organic light luminescence layer 140a is in a range from 1 wt % to 88 wt %. Further, the peak wavelength of excited light from the fluorescent particle 144 of the organic light luminescence layer 140a is greater than the peak wavelength of excited light from the fluorescent particle 134 of the inorganic light luminescence layer 130.

Figure 4:
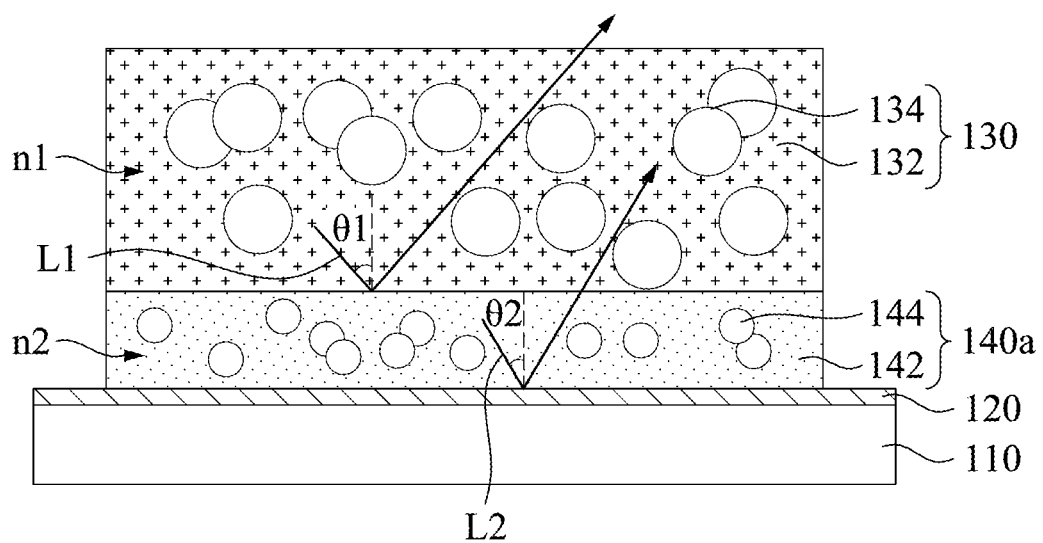
FIG. 4 is a schematic view of the wavelength conversion element of FIG. 3 when reflecting lights.

FIG. 4 is a cross-sectional view of the wavelength conversion element 100a of FIG. 3 when reflecting lights. As shown in FIG. 4, the inorganic light luminescence layer 130 and the organic light luminescence layer 140a have different refractive index. When an incident angle 81 of a first excited light L1 on an interface between the inorganic light luminescence layer 130 and the organic light luminescence layer 140a is greater than a critical angle ($8c$), the first excited light L1 will be reflected back to an incident end (e.g., the top surface of the inorganic light luminescence layer 130) through total reflection. In the process of total reflection, there will be no energy loss. The first excited light L1 is referred to as an incident light (e.g., blue laser) excited by the fluorescent particle 134. In addition, when incident light has an incident angle smaller than the critical angle (θc), it will further enter the organic light luminescence layer 140a to form a second excited light L2, and the second excited light L2 is reflected back to the inorganic light luminescence layer 130 by the reflective layer 120. Since the incident angle 82 of the second excited light L2 is smaller than the critical angle (θc), total reflection would not occur.

Through the configuration of the organic light luminescence layer 140a, the excited fluorescence and part of non-converted light (e.g., blue laser) can be utilized to excite with the fluorescent particle 144 having a long wavelength for conversion. As a result, usage of the incident light (e.g., blue laser) can increased and function of adjusting light conversion wavelength is achieved. Further, since the organic light luminescence layer 140a is thin enough, the organic light luminescence layer 140a would not affect the heat conduction from the inorganic light luminescence layer 130 to the substrate 110.

Moreover, in order to achieve above-mentioned total reflection, a refractive index n1 of the inorganic light luminescence layer 130 is greater than a refractive index n2 of the organic light luminescence layer 140a. For example, the first glue binder 132 of the inorganic light luminescence layer 130 may be made of glass, transparent ceramic, or fluorescent ceramic, in which the refractive index of glass is about 1.54, the refractive index of transparent ceramic is about 1.76, and the refractive index of fluorescent ceramic is about 1.83. The second glue binder 142 of the organic light luminescence layer 140a may be made of silicon or resin, in which the refractive index of either silicon or resin is in a range from 1.4 to 1.5. The first glue binder 132 of the inorganic light luminescence layer 130 and the second glue binder 142 of the organic light luminescence layer 140a can be selected by actual need as long as the refractive index n1 of the inorganic light luminescence layer 130 is greater than the refractive index n2 of the organic light luminescence layer 140a.

Take 3DLP technology for example, in contrast to a ratio of a red light wave band for the excited light in FIG. 2, a ratio of a red light wave band for the excited light in FIG. 3 can be improved so as to enhance user's visual experience. Accordingly, under the circumstances of not sacrificing total luminance, the organic light luminescence layer 140a is disposed between the first luminescence layer 130 and the reflective layer 120, which is beneficial to improve of color rendering. For example, a ratio of a red light wave band for the excited light in FIG. 3 may increase about 5% (e.g., from 100% to 105%) to make color more vivid after light dispersion, and thus the user's visual experience can be improved. In some embodiments, in contrast to a ratio of a yellow light wave band for the excited light in FIG. 2, a ratio of a yellow light wave band for the excited light in FIG. 3 may increase in a range from 2% to 3% (e.g., from 100% to 102.7%). Further, in contrast to a ratio of a green light wave band for the excited light in FIG. 2, a ratio of a green light wave band for the excited light in FIG. 3 may increase in a range from 1% to 2% (e.g., from 100% to 101.6%).

Figure 5:
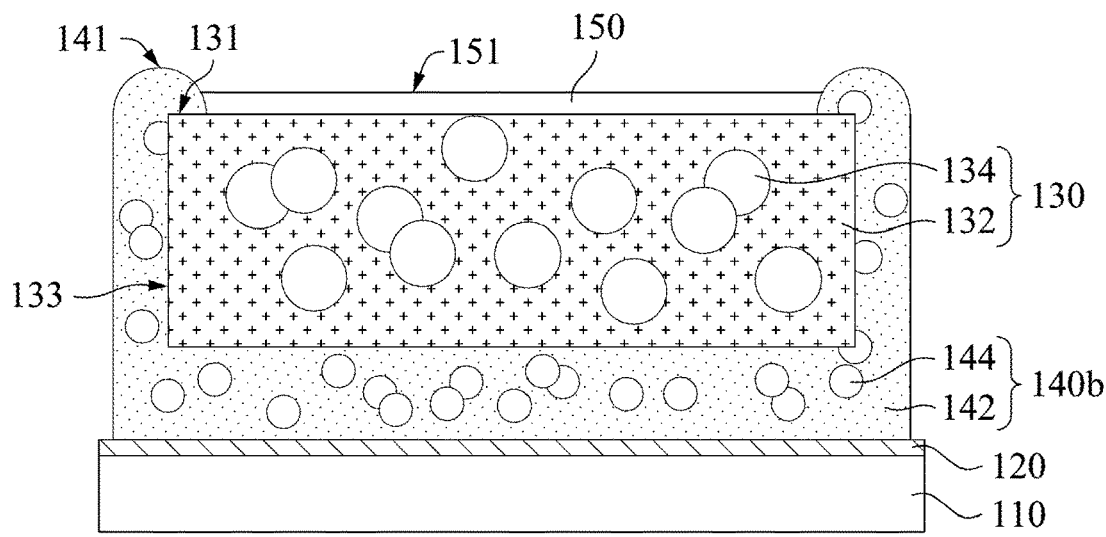
FIG. 5 is a cross-sectional view of a wavelength conversion element in accordance with another embodiment of the present disclosure.

FIG. 5 is a cross-sectional view of a wavelength conversion element 100b in accordance with another embodiment of the present disclosure. As shown in FIG. 5, the wavelength conversion element 100b includes the substrate 110, the reflective layer 120, the inorganic light luminescence layer 130, an organic light luminescence layer 140b, and an anti-reflective coating film or a microstructure 150. Compared to the wavelength conversion element 100a in FIG. 3, the wavelength conversion element 100b in FIG. 5 further has the anti-reflective coating film or the microstructure 150, and the organic light luminescence layer 140b of the wavelength conversion element 100b in FIG. 5 has different profile. Configurations of the substrate 110, the reflective layer 120 and the inorganic light luminescence layer 130 are similar to the embodiment shown in FIG. 3, and the description is not repeated hereinafter.

In the present embodiments, the organic light luminescence layer 140b further extends to a top surface 131 of the inorganic light luminescence layer 140b along a sidewall 133 of the inorganic light luminescence layer 130. One portion of the top surface 131 of the inorganic light luminescence layer 130 is covered by the organic light luminescence layer 140b, and the other portion of the top surface 131 of the inorganic light luminescence layer 130 is exposed. In some embodiments, a top surface 141 of the organic light luminescence layer 140b is higher than the top surface 131 of the inorganic light luminescence layer 130.

In the present embodiments, the anti-reflective coating film or the microstructure 150 is disposed on the top surface 131 of the inorganic light luminescence layer 130. In other words, the anti-reflective coating film or the microstructure 150 covers the exposed top surface 131 of the inorganic light luminescence layer 130. As such, reflection of the incident light (for example, the first excited light L1 in FIG. 4) on the top surface 131 of the inorganic light luminescence layer 130 can be reduced and efficiency for exciting the fluorescent particle 134 can be increased.

The anti-reflective coating film or the microstructure 150 is in contact with the inorganic light luminescence layer 130. In some embodiments, a top surface 151 of the anti-reflective coating film or the microstructure 150 is exposed. The top surface 141 of the organic light luminescence layer 140b is higher than the top surface 151 of the anti-reflective coating film or the microstructure 150.

Figure 6:
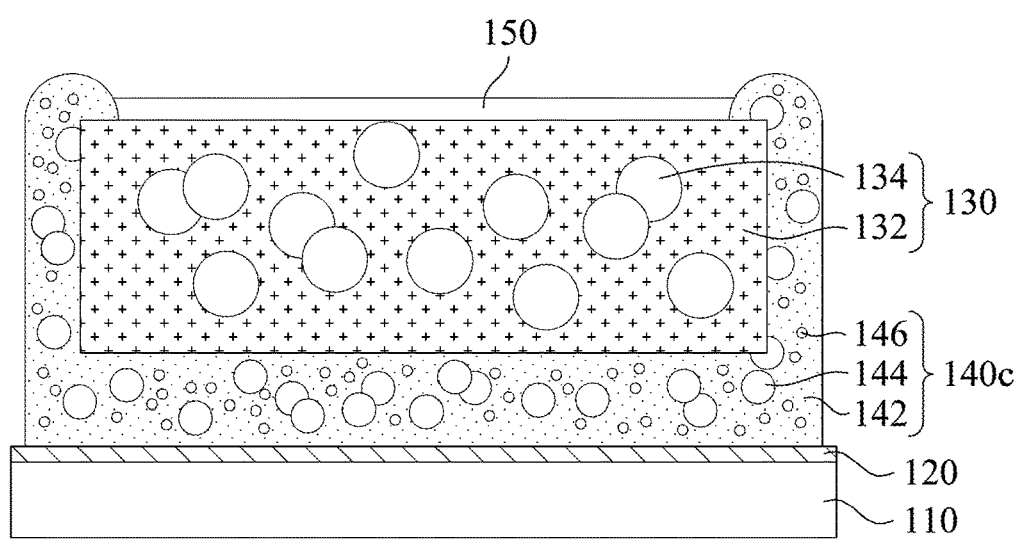
FIG. 6 is a cross-sectional view of a wavelength conversion element in accordance with another embodiment of the present disclosure.

FIG. 6 is a cross-sectional view of a wavelength conversion element 100c in accordance with another embodiment of the present disclosure. As shown in FIG. 6, the wavelength conversion element 100c includes the substrate 110, the reflective layer 120, the inorganic light luminescence layer 130, an organic light luminescence layer 140c, and the anti-reflective coating film or a microstructure 150. Compared to the wavelength conversion element 100b in FIG. 5, the organic light luminescence layer 140c of the wavelength conversion element 100c in FIG. 6 further has a white functional particle 146. Configurations of the substrate 110, the reflective layer 120 and the inorganic light luminescence layer 130 and the anti-reflective coating film or a microstructure 150 are similar to the embodiment shown in FIG. 5, and the description is not repeated hereinafter.

In the present embodiments, the white functional particle 146 of the organic light luminescence layer 140c is configured to adjust scattering path of the excited light (for example, the second excited light L2 in FIG. 4). Specifically, the white functional particle 146 the organic light luminescence layer 140c is configured to increase scattering path and thermal conductivity. The white functional particle 146 has higher refractive index and thermal conductivity than the second glue binder 142. In some embodiments, the refractive index of the white functional particle 146 is greater than 1.7 and smaller than 3. The thermal conductivity of the white functional particle 146 is in a range from 10 W/m·K to 30 W/m·K. The white functional particle 146 may be made of Al$_2$O$_3$, TiO$_2$, ZnO, ZrO$_2$, Ta$_2$O$_5$, or other suitable materials. Table 1 below shows example materials for the white functional particle 146.

TABLE 1

Materials for the white functional particle

|  | TiO$_2$ | ZnO | Al$_2$O$_3$ |
|---|---|---|---|
| refractive index | 2.7 | 2.0 | 1.8 |
| thermal conductivity (W/m · K) | 10.3 | 26 | 30 |

Although the present disclosure has been described in considerable detail with reference to certain embodiments thereof, other embodiments are possible. Therefore, the spirit and scope of the appended claims should not be limited to the description of the embodiments contained herein.

It will be apparent to those skilled in the art that various modifications and variations can be made to the structure of the present disclosure without departing from the scope or spirit of the disclosure. In view of the foregoing, it is intended that the present disclosure cover modifications and variations of this disclosure provided they fall within the scope of the following claims.

What is claimed is:

1. A reflective wavelength conversion element, comprising:
    a substrate;
    a reflective layer over the substrate;
    an inorganic light luminescence layer over the reflective layer, comprising a first fluorescent material; and
    an organic light luminescence layer between the reflective layer and the inorganic light luminescence layer, comprising a second fluorescent material, wherein a refractive index of the inorganic light luminescence layer is greater than that of the organic light luminescence layer, and a thickness of the inorganic light luminescence layer is greater than a thickness of the organic light luminescence layer, and a peak wavelength of fluorescent light from the organic light luminescence layer is greater than that of the inorganic light luminescence layer.

2. The reflective wavelength conversion element of claim 1, wherein a concentration of the first fluorescent material of the inorganic light luminescence layer is in a range from 50 wt % to 100 wt %.

3. The reflective wavelength conversion element of claim 2, wherein the inorganic light luminescence layer comprises a first glue binder made of glass, ceramic, or fluorescent ceramic.

4. The reflective wavelength conversion element of claim 1, wherein the organic light luminescence layer comprises a second glue binder and a fluorescent particle.

5. The reflective wavelength conversion element of claim 4, wherein the second glue binder of the organic light luminescence layer is made of resin or silicone.

6. The reflective wavelength conversion element of claim 4, wherein a concentration of the fluorescent particle of the organic light luminescence layer is in a range from 1 wt % to 88 wt %.

7. The reflective wavelength conversion element of claim 1, wherein the thickness of the inorganic light luminescence layer is in a range from 0.02 mm to 1 mm.

8. The reflective wavelength conversion element of claim 1, wherein the thickness of the organic light luminescence layer is in a range from 1 μm to 500 μm.

9. The reflective wavelength conversion element of claim 1, wherein the organic light luminescence layer further extends to a top surface of the inorganic light luminescence layer along a sidewall of the inorganic light luminescence layer.

10. The reflective wavelength conversion element of claim 9, further comprising:
    an anti-reflective coating film or a microstructure on the top surface of the inorganic light luminescence layer.

11. The reflective wavelength conversion element of claim 1, wherein the organic light luminescence layer further comprises a white functional particle therein, and a refractive index of the white functional particle is greater than 1.7 and smaller than 3.

12. The reflective wavelength conversion element of claim 11, wherein the white functional particle is made of Al$_2$O$_3$, TiO$_2$, ZnO, ZrO$_2$, or Ta$_2$O$_5$.

* * * * *